(12) United States Patent
Emoto

(10) Patent No.: US 6,717,250 B1
(45) Date of Patent: Apr. 6, 2004

(54) STACKED SEMICONDUCTOR APPARATUS AND ELECTRONIC DEVICE INCLUDING STACKED SEMICONDUCTOR APPARATUS

(75) Inventor: Yoshiaki Emoto, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/688,964

(22) Filed: Oct. 17, 2000

(30) Foreign Application Priority Data

Oct. 20, 1999 (JP) ............................................. 11-298540

(51) Int. Cl.[7] ............................................... H01L 23/02
(52) U.S. Cl. ......................... 257/686; 257/668; 257/723
(58) Field of Search ................................. 257/668, 702, 257/723, 724, 725, 726, 686, 685, 688

(56) References Cited

U.S. PATENT DOCUMENTS

| | | | |
|---|---|---|---|
| 5,776,797 A | * | 7/1998 | Nicewarner et al. ......... 438/107 |
| 6,121,676 A | * | 9/2000 | Solberg ...................... 257/686 |
| 2001/0006252 A1 | * | 7/2001 | Kim et al. ................... 257/688 |

FOREIGN PATENT DOCUMENTS

| | | |
|---|---|---|
| JP | 6-204399 | 7/1994 |
| JP | 8-167630 | 6/1996 |

OTHER PUBLICATIONS

Harper, Electronic Packaging Interconnection Handbook, 1991, McGraw–Hill, 10.32–10.33.*

* cited by examiner

*Primary Examiner*—Nathan J. Flynn
*Assistant Examiner*—Leonardo Andújar
(74) *Attorney, Agent, or Firm*—Oliff & Berridge, PLC

(57) ABSTRACT

A plurality of semiconductor chips electrically connected to wires formed on a carrier tape are aligned in order to provide a small semiconductor apparatus with good heat radiation. An electronic device using this semiconductor apparatus as the carrier tape is folded inward and wound in a spiral shape, and layers are laminated so that fabrication can be good. After this carrier tape is folded inward, sequentially wound in a spiral shape, and layers of the semiconductor chips are laminated, they are covered by a molding resin.

17 Claims, 3 Drawing Sheets

STACKED SEMICONDUCTOR APPARATUS AND ELECTRONIC DEVICE INCLUDING STACKED SEMICONDUCTOR APPARATUS

BACKGROUND OF THE INVENTION

1. Field of the Invention

This invention relates to a semiconductor apparatus and an electronic device, and to a small semiconductor apparatus and electronic device which can improve heat radiation.

2. Description of Related Art

Recently, a multi-chip package (Multi-Chip Package) fabricated by arranging a plurality of semiconductor chips within one package as an electronic device is improved with high capability and made compact, and a semiconductor apparatus is improved with high capability and made compact. Furthermore, in the multi-chip package (MCP), a planar type MCP in which a plurality of semiconductor chips are arranged in a planar manner and a stacked type MCP in which a plurality of semiconductor chips are laminated in a thickness direction are available. A planar type MCP in which semiconductor chips are arranged in a planar manner needs a wide mounting area, so a contribution percentage to a small electronic device is small. Because of this, development of a stacked type MCP in which semiconductor chips are laminated has been popular. As this example, Japanese Laid-Open Patent Application Nos. 6-204399 and 8-167630 disclose a technology or the like in which a module is formed as semiconductor chips are sealed in a package, then perpendicularly stacked, and electrically connected between packages by using via holes and through holes.

SUMMARY OF THE INVENTION

However, in the conventional stacked type MCP, in order to connect layers, via holes and through holes need to be formed. Therefore, there is a problem that a fabricating process becomes complex. That is, in a stacked type MCP, semiconductor chips and a wiring substrate are electrically connected, a plurality of chip carriers are created which become stacked units when a stacked type MCP is fabricated, and these chip carriers, a condenser film, a thermally conductive substrate, and a package base are bonded to a bonding film. Furthermore, through holes are formed, and electrical connection is performed between the part in which layers are stacked and bonded. At this time, for the process of via holes and through holes, fabricating processes such as positioning between layers, processing holes, and filling the holes with a conductor, or plating process and the like, are difficult. Because of this, Japanese Laid-Open Patent Application 8-167630 discloses that, without using a fabricating process in which it is difficult to fabricate via holes, through holes, or the like, semiconductor chips are mounted in an insulation film tape performed by a copper wiring, and stacked semiconductor chips are electrically connected. In a semiconductor module provided with at least one semiconductor chip, a substrate which mounts the semiconductor chip or more, and a wire which is electrically connected to the semiconductor chip or more formed on the substrate, layers are stacked by folding the substrate, and interfaces of the layers of substrate are bonded by a bonding means. Additionally, at the interfaces folded layers, a heat dispersion substrate is arranged, and heat is dispersed. Furthermore, it is described that, at the interfaces of the folded interlayers, a rigidity assurance substrate is arranged, rigidity of a semiconductor module is improved, solder balls can be prevented from floating up by deformation such as warping or the like, and electrical connection of a semiconductor module and a wiring substrate is assured. However, in this application, layers are stacked by folding the substrate inward and outward. Semiconductor chips are aligned in the same space as the fold lines of the inward portions. Furthermore, active surfaces of the semiconductor chips are opposingly arranged within the space. Heat generated from the opposite semiconductor chips affects each other, further increases the temperature, generates an abnormal operation in the semiconductor chips, and generates abnormality in the semiconductor module based on the abnormal operation. In particular, when the active surfaces of the semiconductor chips are arranged at opposing positions, heat affects each other and easily generates an abnormal operation. Because of this, in this publication, a heat dispersion substrate is arranged between semiconductor chips, and heat is dispersed. However, because they are arranged in contact with the active surfaces, heat generated by the semiconductor chips via the heat dispersion substrate affects each other, and the temperature does not decrease. Therefore, there is still a problem that an abnormal operation is generated in the semiconductor chips by increasing the temperature. Because of this, there is a need for making a heat dispersion substrate thick or making an interval of the opposite semiconductor chips wide, and the semiconductor chips become large (thick). Furthermore, the semiconductor chips are mounted in an insulation film tape, so heat radiation to a bonding means (molding resin) via the insulation film tape from the semiconductor chips is poor, and the temperature of the semiconductor chips increases. Additionally, the substrate is fabricated inward and outward, so fabrication is complex.

This invention reflects on the above-mentioned conventional problem. An object of this invention is to provide a small semiconductor apparatus with good heat radiation by winding a carrier tape inward in a spiral state and laminating layers, and an electronic device using the semiconductor apparatus. Furthermore, a second object of this invention is to arrange the active surfaces of the semiconductor chips without facing each other, assure heat dispersion, and perform a normal operation.

In order to accomplish the above-mentioned object, in a semiconductor apparatus related to this invention, a plurality of semiconductor chips electrically connected to wires formed on a carrier tape are aligned, the semiconductor chips are stacked by sequentially winding a carrier tape inward in a spiral shape and covered by molding resin.

In this invention which is thus structured, a carrier tape is formed inward. At the same time, because the carrier tape is sequentially wound and enlarged in a spiral shape, semiconductor chips are laminated, and layers are made, a small semiconductor apparatus can be easily fabricated.

In addition, a semiconductor apparatus related to this invention sequentially enlarges an arrangement interval of adjacent semiconductor chips on the carrier tape. As the active surfaces of the semiconductor chips are made to be non-opposing, the carrier tape is sequentially wound in a spiral shape, semiconductor chips are stacked, and layers are made and covered by molding resin.

In this invention which is thus structured, semiconductor chips are not arranged in a surface in which active surfaces mutually face, heat does not increase as heat generated from the active surfaces mutually act on, and the temperature of semiconductor chips does not increase frequently. Because of this, an abnormal operation is not generated in semiconductor chips, and a semiconductor module is normally operated.

In addition, in a semiconductor apparatus related to this invention, having no carrier tape between the laminated semiconductor chips is preferable.

In this invention which is thus structured, spacing between semiconductor chips can be made small by the amount that the carrier tape is omitted in the laminated semiconductor chips, so thickness of a semiconductor module can be made thin. Additionally, a carrier tape with poor heat conduction is not arranged, so heat radiation of semiconductor chips improves, the temperature does not increase frequently, and generation of an abnormal operation can be prevented.

Furthermore, in a semiconductor apparatus related to this invention, it is preferable that, adjacent to the aligned semiconductor chips, an interposer made of a tape material is arranged on a carrier tape, and an external connection terminal is arranged in the interposer.

In this invention which is thus structured, adjacent to the aligned semiconductor chips, an interposer formed of a tape material is arranged in a carrier tape, and an external connection terminal is arranged in the interposer, so an external connection terminal portion is assisted by the interposer, and cost becomes cheap due to a single layer of wires.

Furthermore, it is preferable that the electronic device related to this invention is provided with the semiconductor apparatus which is thus structured.

In this invention which is thus structured, an electronic device can be obtained in which heat is generated less frequently, a device which can prevent heat increase can be made small, and abnormal operation due to heat occurs less frequently.

DETAILED DESCRIPTION OF PREFERRED EMBODIMENTS

The following explains details of preferred embodiments of a semiconductor apparatus and an electronic device related to this invention in accordance with the attached drawings.

Figure 1:
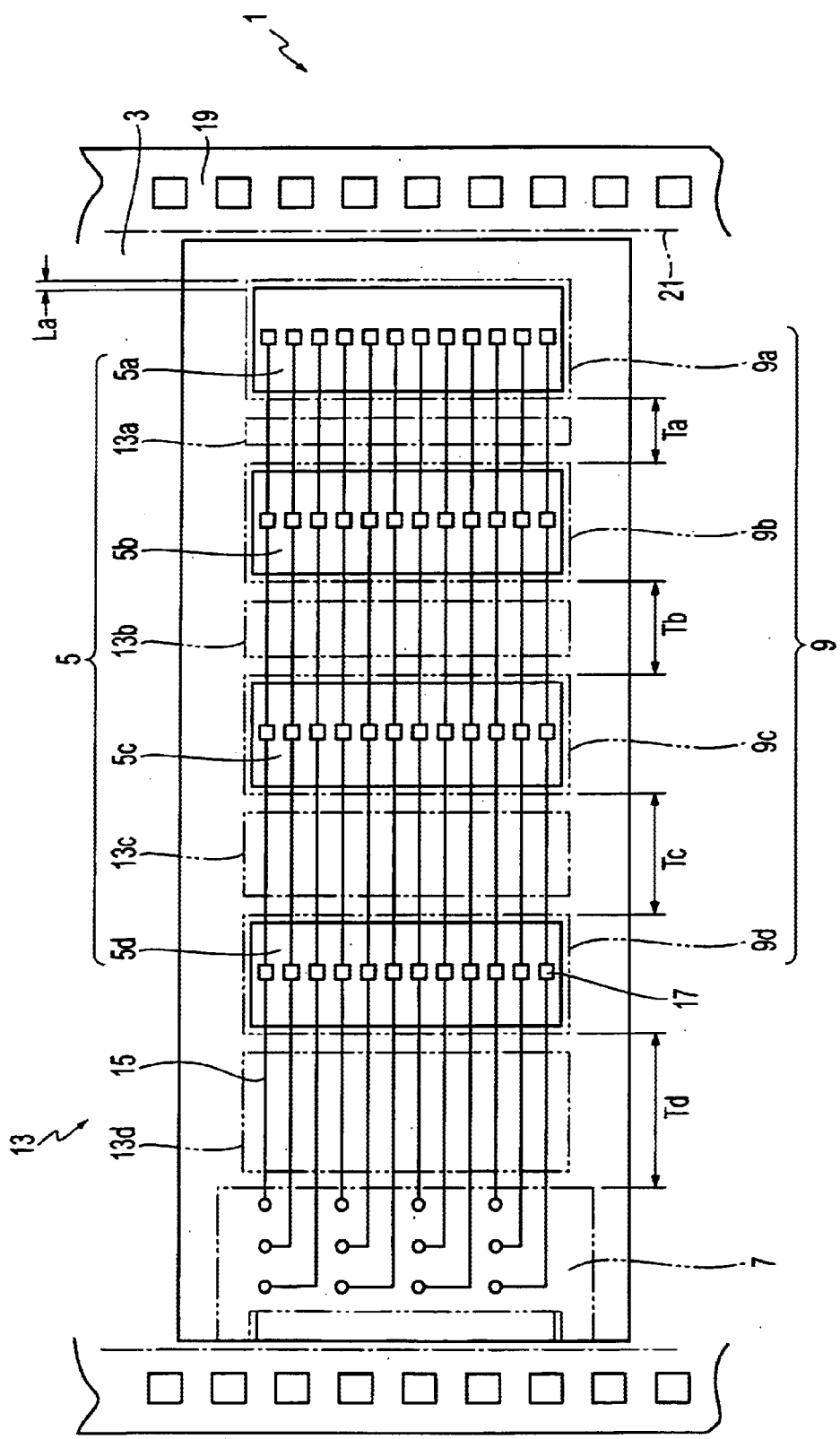
FIG. 1 is a developing planar view of a semiconductor apparatus related to a first embodiment of this invention.
Figure 2:
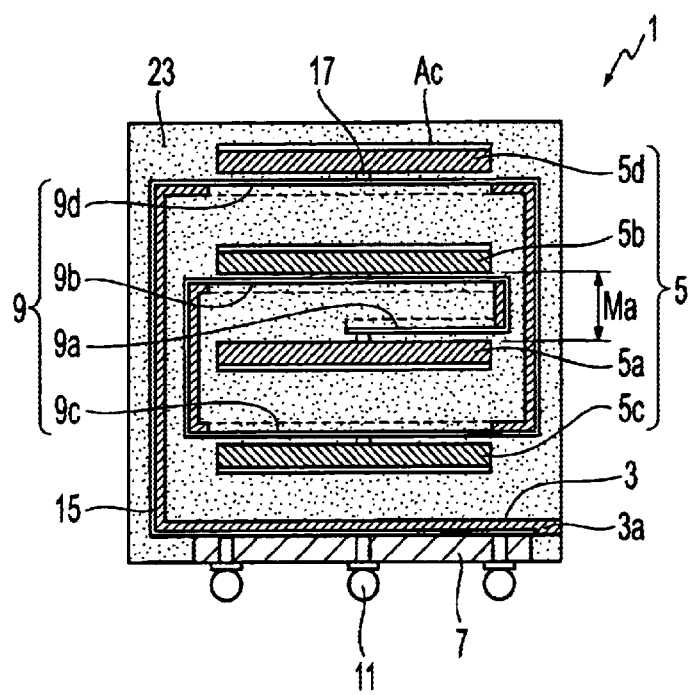
FIG. 2 is a side cross-sectional view of a semiconductor apparatus related to a first embodiment of this invention.

FIG. 1 is a developing planar view of a semiconductor apparatus related to a first embodiment of this invention. FIG. 2 is a side cross-sectional view of a semiconductor apparatus.

In FIG. 1, in a semiconductor apparatus 1, a plurality of (four in this embodiment) of semiconductor chips 5 (shown by solid lines) and an interposer 7 formed of a tape material (shown by three-dot lines) is mounted on a carrier tape material 3. In this embodiment, from the right side of the drawing, the semiconductor chips 5 include a first semiconductor chip 5a, a second semiconductor chip 5b, a third semiconductor chip 5c, and a fourth semiconductor chip 5d in this order. Furthermore, the interposer 7 is electrically connected and arranged adjacent to the fourth semiconductor chip 5d. The semiconductor chips 5 are mounted on the carrier tape material 3 in a state in which the active surface (Ac of FIG. 2), on which elements such as transistors, resistors, condensers and/or the like are formed, is arranged in an upper direction of the figure. Furthermore, in a non-active surface of the rear surface of the semiconductor chips 5 formed of a silicon chip or the like, an insulation film such as a silicon oxide film ($SiO_2$ film) or the like is formed.

In the carrier tape material 3, a plurality of (four in this embodiment) device holes 9 are formed in the respective locations in which the respective semiconductor chips 5 are mounted. In this embodiment, the device holes 9 are formed of a first device hole 9a, a second device hole 9b, a third device hole 9c, and a fourth device hole 9d in order from the right side of the figure. These device holes 9 are formed larger than the outer dimension of the semiconductor chips 5, and in this embodiment, as shown in FIG. 1, a spacing of a predetermined dimension La is provided. That is, next to the first semiconductor chip 5a, spaced by a predetermined dimension Ta, the second semiconductor chip 5b is arranged at a location of the second device hole 9b arranged in the carrier tape material 3. Here, when the outer dimension of the first semiconductor chip 5a is the same as in the second semiconductor chip 5b, a hole whose dimensions is the same as the first device hole 9a is made in the second device hole 9b. Additionally, when the outer dimension of the first semiconductor chip 5a is different from the outer dimension of the second semiconductor chip 5b, spacing between the first device holes 9a and the second device hole 9b is made substantially the same, and holes with different dimensions are made. With respect to other device holes 9, the explanation is omitted below, but the same structure is used. Additionally, next to the second semiconductor chip 5b, spaced by a distance Tb larger than the predetermined dimension Ta, the third semiconductor chip 5c is mounted at a location of the third device hole 9c arranged in the carrier tape material 3. Furthermore, in the same manner as described above, next to the third semiconductor chip 5c, separated by a distance Tc larger than the predetermined dimension Tb, the fourth semiconductor chip 5d is mounted at a location of the fourth device hole 9d arranged in the carrier tape material 3. In this embodiment, four semiconductor chips 5 which were described above are used, but this is not limited to this. Two, three, four semiconductor chips, or more are acceptable. In addition, in other embodiment, it is also acceptable that the device holes 9 can be made smaller than the outer dimension of the semiconductor chips 5, and superimposed in an undepicted predetermined dimension, and the semiconductor chips 5 can be mounted. As described above, in the device holes 9, an insulation film tape 3a of a carrier tape material 3, which will be discussed later, is removed, so heat radiation from the semiconductor chips 5 is improved.

In the interposer 7 which is arranged adjacent to the fourth semiconductor chip 5d, an external connection terminal 11 formed of a solder ball or the like electrically connected to outside is arranged. This external connection terminal can also be formed in a pin structure.

As described above, progressing leftward, that is, from the first semiconductor chip 5a to the second semiconductor chip 5b, from the second semiconductor chip 5b to the third semiconductor chip 5c, and from the fourth semiconductor chip 5d to the external connection terminal 11, the predetermined distance Tb is wider compared to a distance Ta the predetermined distance Tc formed wider than the distance Tb. For example, this predetermined distance is set at Tb=1.5×Ta, Tc=2.0×Ta, and Td=2.5×Ta. In the distance T of the carrier tape material 3 between the respective adjacent semiconductor chips 5, folding portions 13 (shown by two-dot lines) are formed. These folding portions 13 are formed with a first folding portion 13a between the first semiconductor chip 5a and the second semiconductor chip 5b, a second folding portion 13b between the second semiconductor chip 5b and the third semiconductor chip 5c, and so forth. When the folding portions 13 are formed at a spacing by removing the insulation film tape 3a which will be discussed later, heat radiation from the semiconductor chips 5 is improved.

The flexible insulation film tape 3a formed of a polyimide material or the like having heat resistance is used for the carrier tape material 3 and can be freely folded. On this carrier tape material 3, the external connection terminal 11 arranged in the interposer 7 and the copper wiring 15 are formed in advance. The copper wiring 15 is electrically connected to the external connection terminal 11 and electrodes 17 of the respective semiconductor chips 5 (5a, 5b, 5c, and 5d) by a TAB (Tape Automated Bonding) technology. Next, after a perforation portion 19 is cut by a cutting wire 21, it is folded inward onto the carrier tape material 3, that is, folded inward, and sequentially wound in a spiral shape and enlarged. By so doing, layers are laminated with respect to the respective semiconductor chips 5 as shown in the upper and lower portions of the figure, and laminated and arranged separated by a predetermined distance Ma.

The following shows that the semiconductor apparatus 1 which was developed as described above is sequentially enlarged and wound in a spiral shape. For example, the active surface of the first semiconductor chip Sa is faced downward and horizontally arranged. Next, the first folding portion 13a is folded in a counterclockwise direction, and the active surface of the semiconductor chip 5b is faced up and horizontally arranged. The active surface of the first semiconductor chip 5a does not face the active surface of the second semiconductor chip 5b, and they are laminated and arranged separated by a predetermined interval (Ma). That is, it is arranged such that a non-active surface of the first semiconductor chip 5a faces a nonactive surface of the second semiconductor chip 5b. Furthermore, the second folding portion 13b is folded in a counterclockwise direction, the active surface of the third semiconductor chip 5c is faced down and horizontally arranged, and it is arranged such that the active surface of the first semiconductor chip 5a faces the non-active surface of the third semiconductor chip 5c. In the same manner, the third folding portion 13c is folded in a counterclockwise direction, the active surface of the fourth semiconductor chip 5d is faced up and horizontally arranged, and it is arranged such that the active surface of the second semiconductor chip 5b faces the non-active surface of the fourth semiconductor chip 5d. Additionally, the fourth folding portion 13d is folded in a counterclockwise direction, the external connection terminal 11 is faced down and horizontally arranged, and it is arranged such that the active surface of the third semiconductor chip 5c and the external connection terminal 11 sandwich the carrier tape material 3 and face each other. By so doing, the developed semiconductor apparatus 1 is laminated so that the respective semiconductor chips 5 do not face the active surfaces. Furthermore, at this time, the respective semiconductor chips 5 are laminated in a state in which the carrier tape material 3 is not sandwiched. In the spaces between the laminated semiconductor chips 5 and the carrier tape material 3, and outside of this, by inserting a molding resin 23 of a predetermined size, the semiconductor apparatus 1 is formed. In the above-mentioned embodiment, when the semiconductor apparatus 1 is sequentially enlarged and wound in a spiral shape, it is bent in a counterclockwise direction. However, even if it is bent in a clockwise direction, the same semiconductor apparatus 1 is obtained.

The semiconductor apparatus 1 which was thus structured is laminated without the active surfaces facing each other, so the temperature of the semiconductor chips 5 does not mutually interact, and the device operates normally and generation of an abnormal operation can be prevented. Furthermore, the semiconductor chips 5 are laminated in a state in which the carrier tape material 3 is not sandwiched, so it can be made small, and heat radiation improves because there is no insulation film tape 3a with poor heat conduction of the carrier tape material 3, and generation of an abnormal operation can be prevented.

Figure 3:
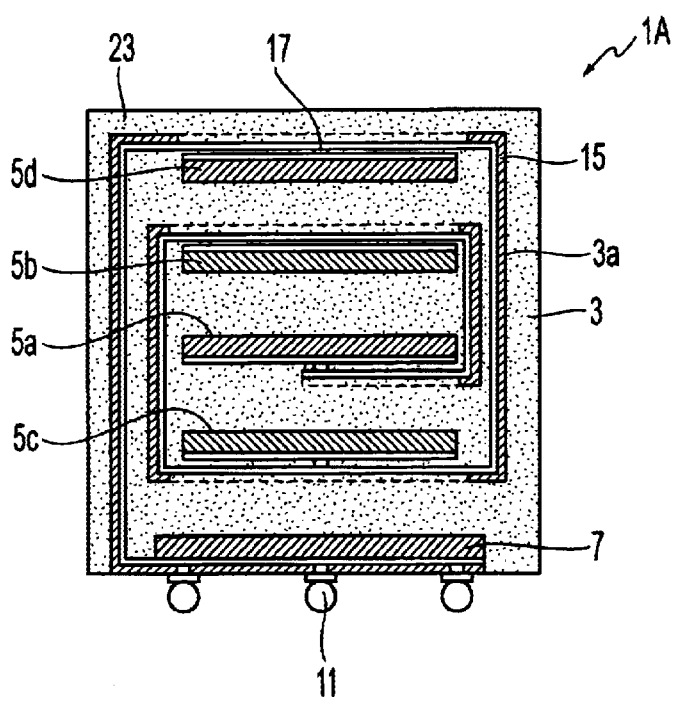
FIG. 3 is a side cross-sectional view of other semiconductor apparatus related to a second embodiment of this invention.

In the first embodiment, on the carrier tape material 3, the active surfaces (Ac) of a plurality of the semiconductor chips 5 are mounted on the carrier tape material 3 in a state which is arranged in an upper direction of the drawing, but the active surface can also be mounted on the carrier tape material 3 in a state in which the active surface is arranged in a lower direction of the drawing. In the second embodiment as well, as shown in a side view of FIG. 3, the semiconductor apparatus 1A can be arranged without facing the active surfaces of the first semiconductor chip 5a and the second semiconductor chip 5b in the same manner as in the above-mentioned case. In this case, the external connection terminal 11 is attached to the interposer via the carrier tape material 3.

Figure 4:
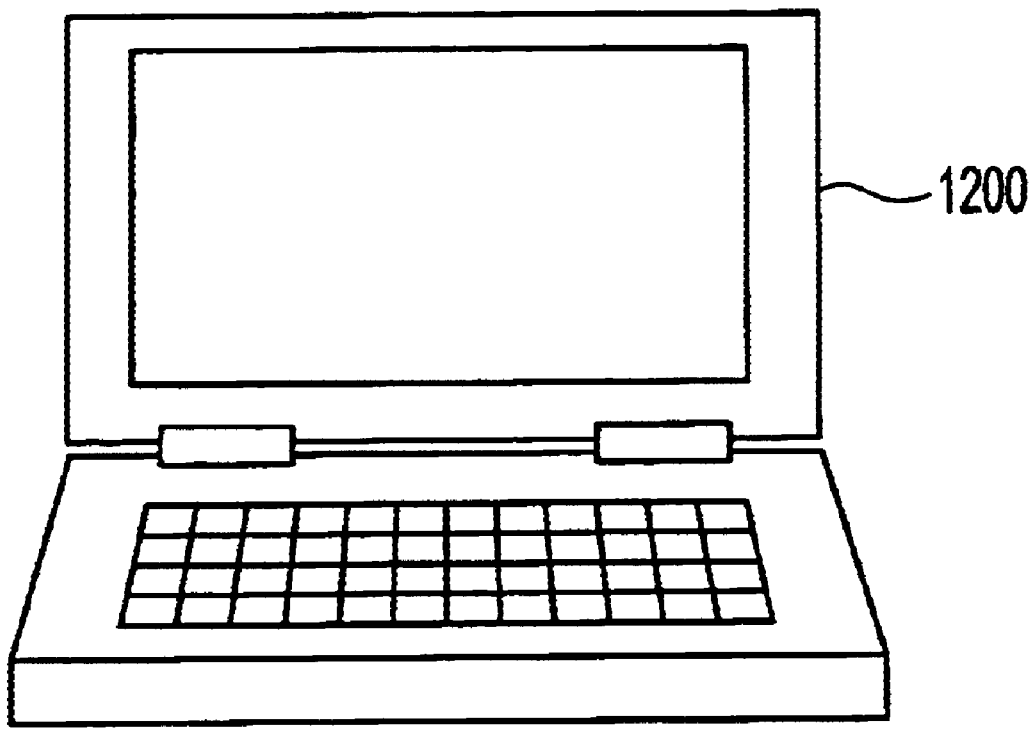
FIG. 4 is an explanatory view of an example in which a semiconductor apparatus is applied to an electronic device related to embodiments of this invention.

Furthermore, as an electronic device provided with this semiconductor apparatus 1, FIG. 4 shows a note type personal computer 50. This note type personal computer 50 is made small because it is provided with a semiconductor apparatus 1 with good heat radiation.

INDUSTRIAL USE OF THE INVENTION

According to this invention explained above, a carrier tape is bent inward only, sequentially enlarged, and wound in a spiral shape, and layers of semiconductor chips are laminated, so a small device can be easily fabricated. Furthermore, the semiconductor chips are not arranged with a carrier tape in-between, so heat radiation improves, and temperature increase of semiconductor chips can be prevented. Additionally, between the laminated semiconductor chips, a space between the semiconductor chips can be made smaller by the amount of the carrier tape which is omitted, so thickness of a semiconductor module can be made thin. In addition, semiconductor chips are not arranged such that active surfaces mutually face, heat does not increase by interaction of heat generated from the active surfaces, and temperature increase of semiconductor chips happens less frequently. Because of this, an abnormal operation is not generated in the semiconductor chips, and a semiconductor module is normally operated.

What is claimed is:

1. A semiconductor apparatus, comprising:
   a carrier tape having material defining holes;
   a plurality of wires; and
   a plurality of semiconductor chips provided on the carrier tape, the holes being formed to provide a space between the material and the semiconductor chips, spacing between adjacent semiconductor chips sequentially increasing along the carrier tape, the plurality of semiconductor chips electrically connected to the wires formed on the carrier tape, the carrier tape being folded inward and sequentially wound in a spiral shape, and layers of the semiconductor chips being laminated and covered by a molding resin, each of the semiconductor chips being respectively arranged over each of the holes with the wires arranged between the holes and the semiconductor chips.

2. The semiconductor apparatus as set forth in claim 1, no carrier tape being provided in spacings between the laminated semiconductor chips.

3. The semiconductor apparatus as set forth in claim 1, further comprising:

an interposer, made of a tape material, arranged on the carrier tape adjacent to the semiconductor chips that are aligned; and an external connection terminal arranged in the interposer.

4. An electronic device, comprising:

the semiconductor apparatus as set forth in claim 1.

5. A semiconductor apparatus, comprising:

a carrier tape having material defining holes;

a plurality of wires; and adjacent semiconductor chips provided on the carrier tape at sequentially increasing intervals, the holes being formed to provide a space between the material and the semiconductor chips, active surfaces of the semiconductor chips not facing each other, the carrier tape being sequentially wound in a spiral shape, and layers of the semiconductor chips being laminated and covered by a molding resin, each of the semiconductor chips being respectively arranged over each of the holes with the wires arranged between the holes and the semiconductor chips.

6. The semiconductor apparatus as set forth in claim 5, no carrier tape being provided in spacings between the laminated semiconductor chips.

7. The semiconductor apparatus as set forth in claim 5, further comprising:

an interposer, made of a tape material, arranged on the carrier tape adjacent to the semiconductor chips that are aligned; and an external connection terminal arranged in the interposer.

8. An electronic device, comprising the semiconductor apparatus as set forth in claim 5.

9. A semiconductor apparatus, comprising:

a carrier tape having material defining holes;

a plurality of wires; and semiconductor chips disposed on the carrier tape, the holes being formed to provide a space between the material and the semiconductor chips, the carrier tape being sequentially folded in a spiral shape so that active surfaces of the semiconductor chips are spaced at least a predetermined distance from each other, each of the semiconductor chips being respectively positioned over each of the holes with the wires arranged between the holes and the semiconductor chips.

10. The semiconductor apparatus as set forth in claim 9, the folded carrier tape and the semiconductor chips being laminated and covered by a molding resin.

11. The semiconductor apparatus as set forth in claim 10, no carrier tape being provided in spacings between the laminated semiconductor chips.

12. The semiconductor apparatus as set forth in claim 9, further including an interposer, made of a tape material, arranged on the carrier tape adjacent to the semiconductor chips that are aligned; and an external connection terminal arranged in the interposer.

13. The semiconductor apparatus as set forth in claim 12, further including wires formed on the carrier tape connecting the interposer with the semiconductor chips.

14. An electronic device, comprising:

the semiconductor apparatus as set forth in claim 9.

15. The semiconductor apparatus as set forth in claim 9, spacing between adjacent semiconductor chips sequentially increasing along the carrier tape.

16. The semiconductor apparatus as set forth in claim 9, further including wires formed on the carrier tape, the semiconductor chips being electrically connected to the wires.

17. The semiconductor apparatus as set forth in claim 9, the carrier tape being folded inward and sequentially wound in the spiral shape.

* * * * *